(12) United States Patent
Sakamoto

(10) Patent No.: US 11,929,266 B2
(45) Date of Patent: Mar. 12, 2024

(54) WAFER SUPPORTING DEVICE

(71) Applicant: NISSIN ION EQUIPMENT CO., LTD., Koka (JP)

(72) Inventor: Takashi Sakamoto, Shiga (JP)

(73) Assignee: NISSIN ION EQUIPMENT CO., LTD., Koka (JP)

( * ) Notice: Subject to any disclaimer, the term of this patent is extended or adjusted under 35 U.S.C. 154(b) by 79 days.

(21) Appl. No.: 17/680,943

(22) Filed: Feb. 25, 2022

(65) Prior Publication Data

US 2022/0336237 A1 Oct. 20, 2022

(30) Foreign Application Priority Data

Apr. 20, 2021 (JP) .................... 2021-70814

(51) Int. Cl.
| | | |
|---|---|---|
| *H01L 21/00* | (2006.01) | |
| *H01J 37/05* | (2006.01) | |
| *H01J 37/20* | (2006.01) | |
| *H01J 37/317* | (2006.01) | |
| *H01L 21/67* | (2006.01) | |
| *H01L 21/683* | (2006.01) | |

(52) U.S. Cl.
CPC ........ *H01L 21/67103* (2013.01); *H01J 37/05* (2013.01); *H01J 37/20* (2013.01); *H01J 37/3171* (2013.01); *H01L 21/6833* (2013.01); *H01J 2237/2007* (2013.01); *H01J 2237/20235* (2013.01)

(58) Field of Classification Search
CPC .......... H01L 21/67103; H01L 21/6833; H01L 21/67213; H01L 21/68764; H01J 37/05; H01J 37/20; H01J 37/3171; H01J 2237/2007; H01J 2237/20235; H01J 2237/2001; H01J 2237/31701
USPC .......................................... 250/492.1–492.3
See application file for complete search history.

(56) References Cited

U.S. PATENT DOCUMENTS

| | | | |
|---|---|---|---|
| 8,724,289 B2* | 5/2014 | Shiraiwa | H01L 21/6831 361/234 |
| 9,960,068 B1* | 5/2018 | Konkola | C23C 16/4586 |
| 10,128,084 B1* | 11/2018 | Baggett | H01J 37/1471 |
| 10,607,874 B2* | 3/2020 | Maehata | H01L 21/67248 |
| 11,367,597 B2* | 6/2022 | Lee | H01J 37/32697 |
| 2002/0075624 A1* | 6/2002 | Wang | H01L 21/6831 361/234 |
| 2007/0103844 A1* | 5/2007 | Eguchi | H01L 21/67103 361/234 |
| 2009/0095733 A1* | 4/2009 | Komatsu | C23C 16/48 219/521 |

(Continued)

FOREIGN PATENT DOCUMENTS

JP 2015-043272 A 3/2015

*Primary Examiner* — Michael Maskell
(74) *Attorney, Agent, or Firm* — Sughrue Mion, PLLC

(57) ABSTRACT

A wafer support device includes a support base having a wafer-facing surface, the support base comprising a heater, and an electrostatic chuck supported by the support base, the electrostatic chuck having an attraction surface configured to attract a wafer for wafer processing. During the wafer processing, the wafer-facing surface and the attraction surface are positioned at respective different positions in a direction perpendicular to the wafer-facing surface so that the attraction surface is separated from the wafer-facing surface by a distance.

20 Claims, 10 Drawing Sheets

(56) References Cited

U.S. PATENT DOCUMENTS

| | | | |
|---|---|---|---|
| 2010/0136799 A1* | 6/2010 | Koshitaka | G03F 7/707 257/E21.328 |
| 2010/0181501 A1* | 7/2010 | Pollock | H01J 37/3171 250/492.21 |
| 2010/0193501 A1* | 8/2010 | Zucker | H01L 21/67248 219/443.1 |
| 2011/0248190 A1* | 10/2011 | Tanaka | H01L 21/67259 414/816 |
| 2012/0100703 A1* | 4/2012 | Kim | H01L 21/67712 250/281 |
| 2013/0248738 A1* | 9/2013 | Suuronen | H01J 37/3171 250/492.21 |
| 2014/0034846 A1* | 2/2014 | Lee | H01J 37/3171 250/453.11 |
| 2015/0036259 A1* | 2/2015 | Cox | H01L 21/6833 361/234 |
| 2018/0130696 A1* | 5/2018 | Konkola | H01J 37/32009 |
| 2018/0211862 A1* | 7/2018 | Konkola | C23C 16/45544 |
| 2021/0358726 A1* | 11/2021 | Ko | H01J 37/32642 |
| 2021/0375650 A1* | 12/2021 | Satyavolu | H01L 21/67196 |
| 2023/0163010 A1* | 5/2023 | Fujii | H01L 21/67346 279/128 |

* cited by examiner

WAFER SUPPORTING DEVICE

CROSS-REFERENCE TO RELATED APPLICATION

This application claims priority from Japanese Patent Application No. 2021-70814, filed in the Japanese Patent Office on Apr. 20, 2021, the entire contents of which being herein incorporated by reference in its entirety.

BACKGROUND

1. Field

The present disclosure relates to a wafer supporting device for supporting a wafer.

2. Description of Related Art

In order to address ion implantation-caused crystal defects in a silicon carbide wafer by post-ion implantation annealing, ion implantation processing is performed under a condition that a temperature of the wafer is raised to a high temperature.

The raising of the wafer temperature is performed using a heater unit built in a wafer supporting device (e.g., a platen).

In the ion implantation processing, the wafer is mechanically scanned in a direction across an ion beam, in a state in which the entire back surface thereof is fixed to an electrostatic chuck.

SUMMARY

It is an aspect to provide a wafer supporting device that reduces thermal stress to be generated in a wafer during ion implantation processing, and to suppress an occurrence of cracking of the wafer during the ion implantation processing and to suppress jumping of the wafer during separation of the wafer from an electrostatic chuck.

According to an aspect of one or more embodiments, there is provided wafer supporting device comprising a support base having a wafer-facing surface, the support base comprising a heater; and an electrostatic chuck supported by the support base, the electrostatic chuck having an attraction surface configured to attract a wafer for wafer processing, wherein, during the wafer processing, the wafer-facing surface and the attraction surface are positioned at respective different positions in a direction perpendicular to the wafer-facing surface so that the attraction surface is separated from the wafer-facing surface by a distance.

According to another aspect of one or more embodiments, there is provided a wafer supporting device comprising a support base having a first surface, the support base comprising a heater; and an electrostatic chuck having an attraction surface, wherein the first surface is spaced apart from the attraction surface by a distance.

According to another aspect of one or more embodiments, there is provided a system comprising an ion source; an analysis electromagnet and an analysis slit that analyze unwanted ions contained in an ion beam extracted from the ion source; and a processing chamber comprising the wafer supporting device, wherein the wafer supporting device is configured to be moved across the ion beam to perform a high temperature process on a wafer.

BRIEF DESCRIPTION OF THE DRAWINGS

The above and/or other aspects will become apparent and more readily appreciated from the following description of various embodiments, taken in conjunction with the accompanying drawings, in which.

DETAILED DESCRIPTION

Figure 1:
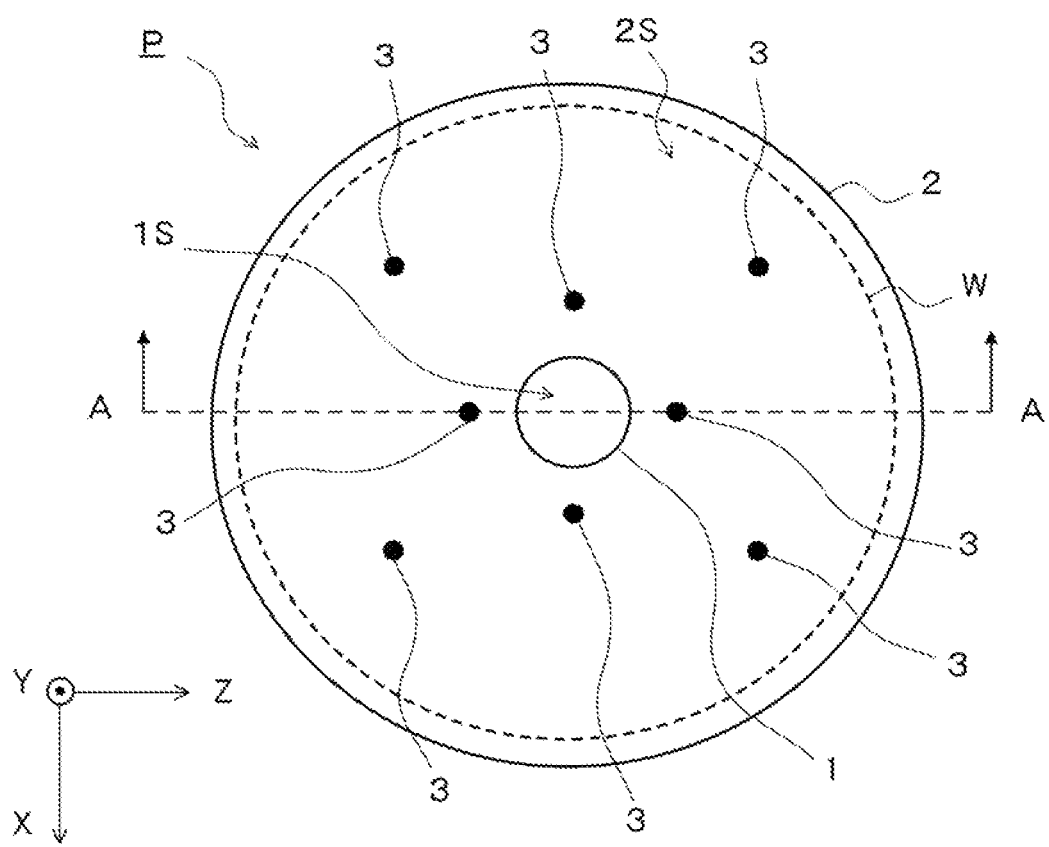
FIG. 1 is a plan view showing an example of a wafer supporting device according to various embodiments.

During the ion implantation processing, a wafer temperature rises as an ion beam is radiated onto the wafer. How high the wafer temperature will rise depends on conditions such as a material and a thickness of the wafer and an amount of ion implantation.

In general, a silicon carbide wafer used for power device applications has a thickness which is less than half as thin as that of a silicon wafer used for memory applications such as DRAM and flash memory, so that the silicon carbide wafer is more likely to be influenced by heat.

If a wafer supporting device that supports the wafer during ion implantation processing is equipped with a cooling medium flow passage, the wafer supporting device may be cooled by a cooling medium to suppress a rise in the temperature of the wafer during the ion implantation processing.

However, when the ion implantation processing is performed on a wafer heated to a high temperature, the wafer supporting device includes a heater to heat the wafer to the high temperature, and the heater built into the wafer supporting device is being used, and therefore the wafer supporting device is unable to cool the wafer by supplying the cooling medium through the cooling medium flow passage.

The silicon carbide wafer whose temperature is raised during the ion implantation processing is urged to expand due to the influence of heat. However, the silicon carbide wafer cannot expand because an entire back surface of the wafer is supported by an electrostatic chuck, and therefore thermal stress is generated in the wafer.

If a large thermal stress exceeding an electrostatic attraction force is generated, there is a disadvantage that the wafer will crack during the ion implantation processing.

Further, there is another disadvantage that, when the wafer is separated from the wafer supporting device after the ion implantation processing, the thermal stress generated during the ion implantation processing is released all at once, causing the wafer to jump up significantly from the wafer supporting device.

While these disadvantages are explained with reference to a silicon carbide wafer, it will be understood that similar disadvantages exists in any other types of wafers to be subjected to ion implantation processing at high temperatures. In particular, when a wafer has a relatively small thickness, these disadvantages are highly likely to occur.

Further, similar disadvantages may occur not only in the ion implantation processing, but also in other wafer processes that occur under high temperatures.

Various embodiments are directed to providing a wafer supporting device capable of reducing thermal stress to be generated in a wafer during wafer processing under high temperatures, and capable of suppressing the occurrence of cracking of the wafer during the wafer processing and capable of suppressing jumping of the wafer during separation of the wafer from the electrostatic chuck.

According to one or more embodiments, there may be provided a wafer supporting device which comprises a support base comprising a wafer-heating heater and having a wafer-facing surface; and an electrostatic chuck supported by the support base, wherein the electrostatic chuck has an attraction surface to which a wafer is attracted, and wherein during wafer processing under high temperatures, the wafer-facing surface and the attraction surface are positioned at respective different positions in a direction perpendicular to the wafer-facing surface, whereby a gap is formed between the wafer attracted to the electrostatic chuck and the wafer-facing surface.

In the wafer supporting device according to various embodiments, during wafer processing under high temperatures, the wafer-facing surface of the support base and the attraction surface of the electrostatic chucks are positioned at the respective different positions, whereby a gap is formed between the wafer attracted to the electrostatic chuck and the wafer-facing surface.

Thus, the wafer supporting device according to various embodiments is configured to support a part of the wafer at a position spaced apart from the wafer-facing surface. Thus, an area of the wafer to be fixed during wafer processing under high temperatures becomes smaller, so that it becomes possible to reduce thermal stress to be generated in the wafer. As a result, it becomes possible to suppress cracking of the wafer during the wafer processing and to suppress jumping of the wafer during separation.

In some embodiments, the electrostatic chuck may be supported on a central region of the support base.

In some embodiments, the support base may include a gas supply passage for releasing gas from the wafer-facing surface.

In some embodiments, a heating temperature by the heater is higher in a peripheral region of the wafer-facing surface than in a central region of the wafer-facing surface.

The wafer supporting device according to various embodiments may reduce thermal stress to be generated in a wafer. Therefore, the wafer supporting device may suppress cracking of the wafer during wafer processing and may suppress jumping of the wafer during separation.

Various embodiments will not be described with reference to the drawings.

Figure 2:
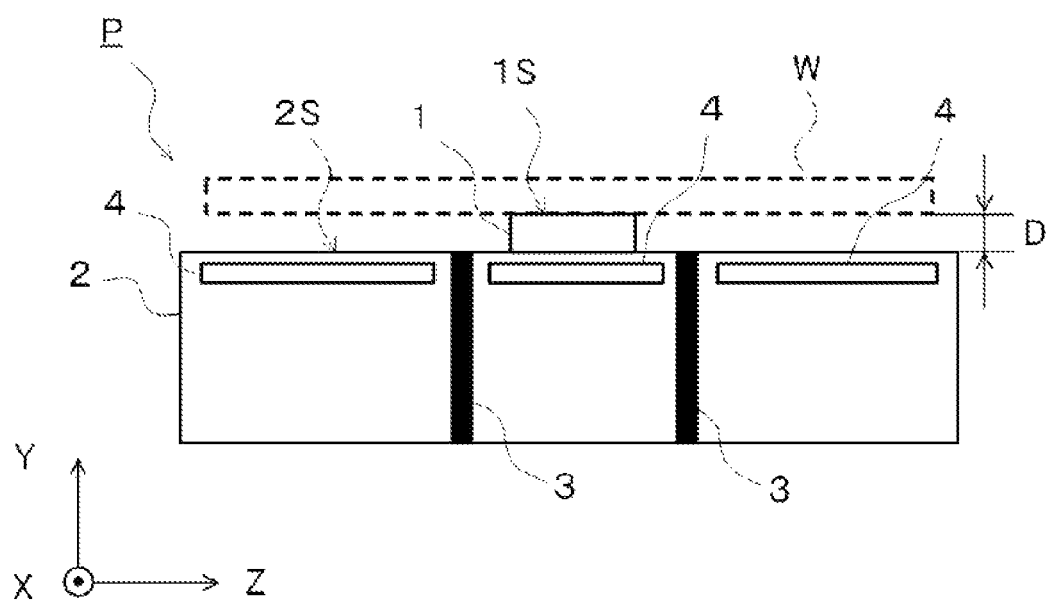
FIG. 2 is a sectional view taken along the line A-A in FIG. 1.

FIG. 1 is a plan view showing a configuration example of a wafer supporting device according to various embodiments. FIG. 2 is a sectional view taken along the line A-A in FIG. 1. A configuration example of the wafer supporting device will be described based on FIGS. 1 and 2.

A wafer supporting device P may include an electrostatic chuck 1 and a support base 2. The support base 2 has a wafer-facing surface 2S, and the electrostatic chuck 1 is disposed on a central region of the wafer-facing surface 2S.

The support base 2 includes a heater 4 for heating a wafer W. The support base 2 comprises a plurality of gas supply passages 3 arranged about the center of the support base 2 in mirror-symmetrical relation with respect to a Z or X axis in FIG. 1. In some embodiments, eight gas supply passages 3 may be provided as shown in FIG. 1. However, embodiments are not limited thereto, and in some embodiments, a different number of gas supply passages may be provided.

Each of the gas supply passages 3 extends through the support base 2 to provide communication between the wafer-facing surface 2S and the other surface of the support base 2. While ion implantation processing is performed, a heat-transfer gas (e.g., hydrogen or helium gas) is supplied toward the wafer-facing surface 2S through the gas supply passages 3.

The electrostatic chuck 1 is supported by the support base 2. The electrostatic chuck 1 has an attraction surface 1S for attracting and supporting the wafer W. FIG. 2 depicts a state in which the wafer W is supported on the attraction surface 1S. The attraction surface 1S of the electrostatic chuck 1 and the wafer-facing surface 2S are positioned at respective different positions in a direction perpendicular to the wafer-facing surface 2S (e.g., Y-axis direction) such that the attraction surface 1S is spaced apart from the wafer-facing surface by a distance D. In some embodiments, the distance D may be 1 cm or less. However, embodiments are not limited to the specific value of 1 cm. Since the wafer W is attracted to the attraction surface 1S during processing, the distance D may define a gap between the wafer W attracted to the electrostatic chuck 1 and the wafer-facing surface 2S of the support base 2. For example, in some embodiments, the gap may be 1 cm or less. However, embodiments are not limited to the specific value of 1 cm.

During ion implantation, warpage due to heat occurs in the wafer W.

An area of the wafer W supported by the electrostatic chuck 1 is fixed, so that no warpage of the wafer W occurs in the area of the wafer supported by the electrostatic chuck 1, but thermal stress is generated.

On the other hand, the remaining area of the wafer W which is not supported by the electrostatic chuck 1 may move freely, so that in the remaining area, no thermal stress is generated, but warpage of the wafer W occurs. However, even if warpage of the wafer W occurs, the wafer W does not come into contact with the wafer-facing surface 2S, because the amount of the warpage falls within the gap.

Even supposing that such a contact between the wafer W and the wafer-facing surface 2S occurs, and the back surface of the wafer is scraped off, the amount of scraping is small as long as the degree of contact is slight.

The distance D and therefore the gap is set to an appropriate value, in relation to the amount of warpage of the wafer W occurring during ion implantation. In some embodiments, the distance may be set experimentally.

The diameter of the wafer W is less than a diameter of the wafer-facing surface 2S of the support base 2. The reason for the different diameters is to allow the wafer W to be placed above the support base 2 so as to enable temperature adjustment of the entire surface of the wafer.

In FIG. 2, the electrostatic chuck 1 is disposed on the wafer-facing surface 2S of the support base 2. Alternatively, in some embodiments, the electrostatic chuck 1 may be disposed inside the support base 2, instead of being disposed on the wafer-facing surface 2S. In this configuration, the electrostatic chuck 1 is embedded inside the support base 2, or a recess is provided on the wafer-facing surface 2S of the support base 2 and then the electrostatic chuck 1 is disposed in the recess.

In this configuration, the thickness and arrangement of the electrostatic chuck 1 are set such that the attraction surface 1S of the electrostatic chuck 1 is separated from the wafer-facing surface 2S of the support base 2 in the direction perpendicular to the wafer-facing surface 2S by the distance D, as in the configuration example in FIG. 2. Accordingly, the gap is formed between the wafer W under processing and the wafer-facing surface 2S, where the gap is equal to the distance D.

As described above, in the configuration illustrated in FIGS. 1 and 2, upon performing an ion implantation process on the wafer W heated to a high temperature (e.g., a temperature greater than room temperature, e.g., to 500° C.), a part of the wafer W is supported by the electrostatic chuck 1, wherein the attraction surface 1S of the electrostatic chuck 1 and the wafer-facing surface 2S of the support base 2 having the heater 4 are spaced apart from each other.

Thus, an area of the wafer to be fixed by the electrostatic chuck becomes smaller, as compared to a related art configuration in which the entire back surface of the wafer is supported by the electrostatic chuck. Accordingly, in the wafer supporting device according to various embodiments, it becomes possible to reduce thermal stress to be generated in the wafer during ion implantation. As a result, it becomes possible to suppress cracking of the wafer during the implantation and to suppress jumping of the wafer during separation of the wafer W from the electrostatic chuck 1.

It should be noted that the above-mentioned wafer supporting device P may be applied to not only ion implantation processing but also other wafer processing that processes a wafer under high temperatures. In such an application, the effect of suppressing cracking during the wafer processing and suppressing jumping during separation can also be obtained.

In FIGS. 1 and 2, the electrostatic chuck 1 is disposed on the central region of the support base 2. Alternatively, in some embodiments, the electrostatic chuck 1 may be disposed on an edge region of the support base 2. Even if the electrostatic chuck 1 is disposed on the edge region of the support base 2, it is also possible to reduce thermal stress to be generated in the wafer during the ion implantation, as in the configuration in FIGS. 1 and 2.

However, in the configuration in which the electrostatic chuck 1 is disposed on the edge region, there is a disadvantage that the support of the wafer W becomes unstable, or that the wafer W warps due to heat and that a portion of the wafer W comes into contact with the wafer-facing surface 2S. Thus, it is advantageous to use the configuration in which the electrostatic chuck 1 is disposed on the central region of the support base 2, as illustrated in FIGS. 1 and 2.

Figure 3:
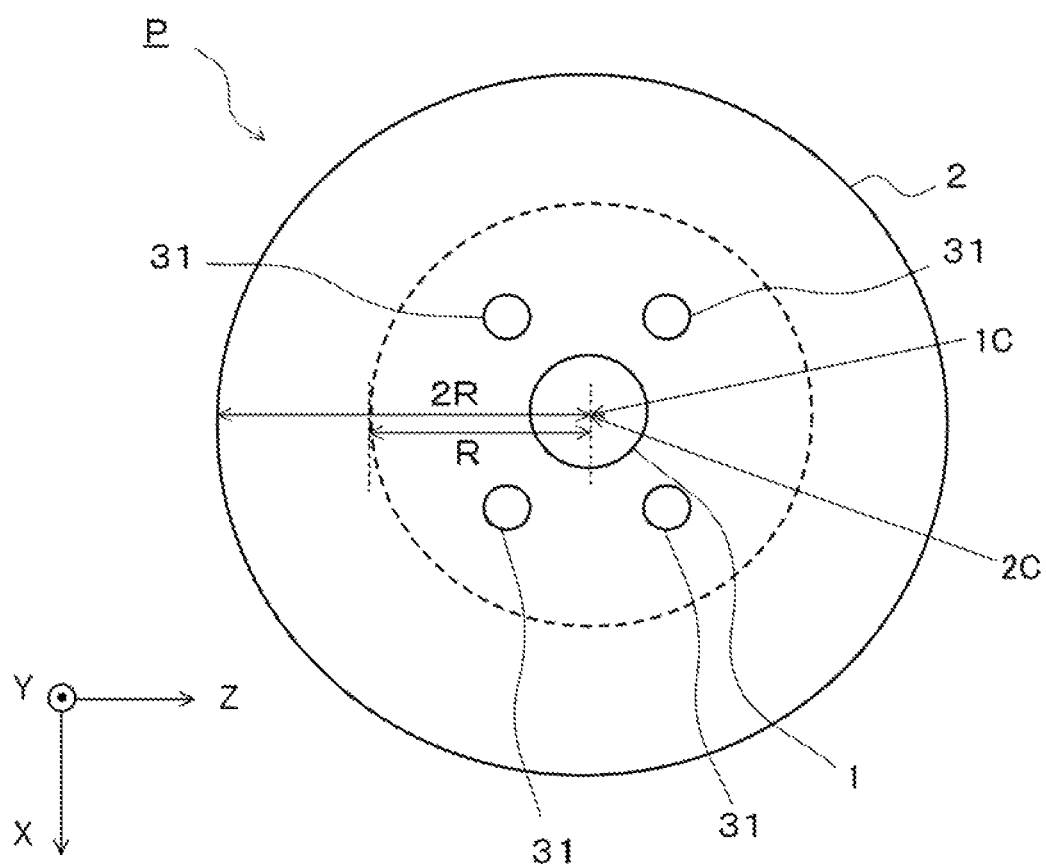
FIG. 3 is an explanatory diagram regarding an arrangement of an electrostatic chuck, according to various embodiments.

FIG. 3 is an explanatory diagram regarding an arrangement of an electrostatic chuck, according to various embodiments. With reference to FIGS. 1-3, the center 2C of the support base 2 having a circular shape in plan view is coincident with the center 1C of the electrostatic chuck 1. However, embodiments are not limited thereto and, in some embodiments, the center 2C and the center 1C may necessarily be coincident with each other. That is, in some embodiments, the center 2C may be deviated from the center 1C.

In FIG. 3, the radius of the support base 2 having a circular shape in plan view is set to 2R. The expression "disposing the electrostatic chuck 1 in the central region of the support base 2" in the present specification means disposing the electrostatic chuck 1 inside a circle having a radius R as illustrated in FIG. 3.

In some embodiments, in addition to the electrostatic chuck 1, one or more additional electrostatic chucks 31 may be disposed. For example, FIG. 3 shows four additional electrostatic chucks 31. However, embodiments are not limited thereto and, in some embodiments, the number of additional electrostatic chucks 31 may be more or less than four. In FIG. 3, the one or more additional electrostatic chucks 31 are disposed inside the circle having a radius R. Alternatively, in some embodiments, the one or more additional electrostatic chucks 31 may be disposed at any position inside or outside the circle having a radius R. Further, the number and/or size of the one or more additional electrostatic chucks 31 are not particularly limited.

A configuration example of an ion implantation apparatus equipped with the wafer support apparatus P will be described in FIGS. 4 to 6.

Figure 4:
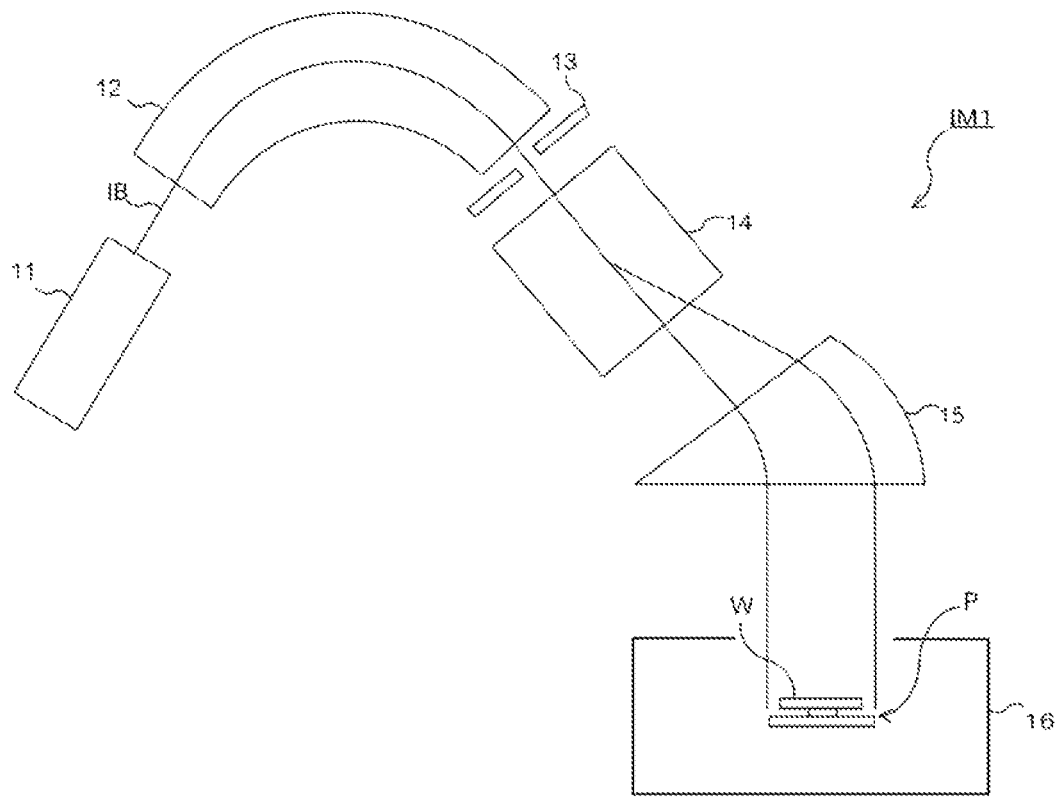
FIG. 4 is a plan view showing an example of an ion implantation apparatus equipped with a wafer supporting device, according to various embodiments.

As illustrated in FIG. 4, an ion implantation apparatus IM1 includes an ion source 11, an analysis electromagnet 12, an analysis slit 13, a magnetic field or electric field scanner 14, a collimator magnet 15, and a processing chamber 16. In the ion implantation apparatus IM1, a spot-shaped ion beam IB is extracted from the ion source 11, and guided to pass through the analysis electromagnet 12 and the analysis slit 13, thereby analyzing unwanted ions contained in the ion beam.

After mass analysis, the ion beam IB is scanned in one direction by the magnetic field or electric field scanner 14, and then guided to pass through the collimator magnet 15 to align traveling directions of the ion beam IB in one direction, thereby forming a parallel ion beam IB, whereafter the parallel ion beam IB is introduced into the processing chamber 16.

In the processing chamber 16, the wafer W supported by the wafer supporting device P is mechanically scanned such that the wafer W is moved across the ion beam in a direction from the back to the front of FIG. 4 by a drive mechanism (not illustrated) such as a motor and appropriate controller, thereby performing ion implantation processing. For example, the controller may include one or more microprocessors or one or more central processing units (CPUs) or one or more logic circuits to actuate the motor to move the wafer supporting device P.

The ion implantation apparatus IM1 in FIG. 4 is an ion implantation apparatus for high-temperature implantation, i.e., for subjecting a wafer W heated to a high temperature to ion implantation processing. However, when the ion implantation apparatus is used to subject a wafer W at normal temperature to ion implantation processing, the wafer supporting device P may be replaced with a wafer supporting device Q configured to support an entire back surface of the wafer W.

Figure 5:
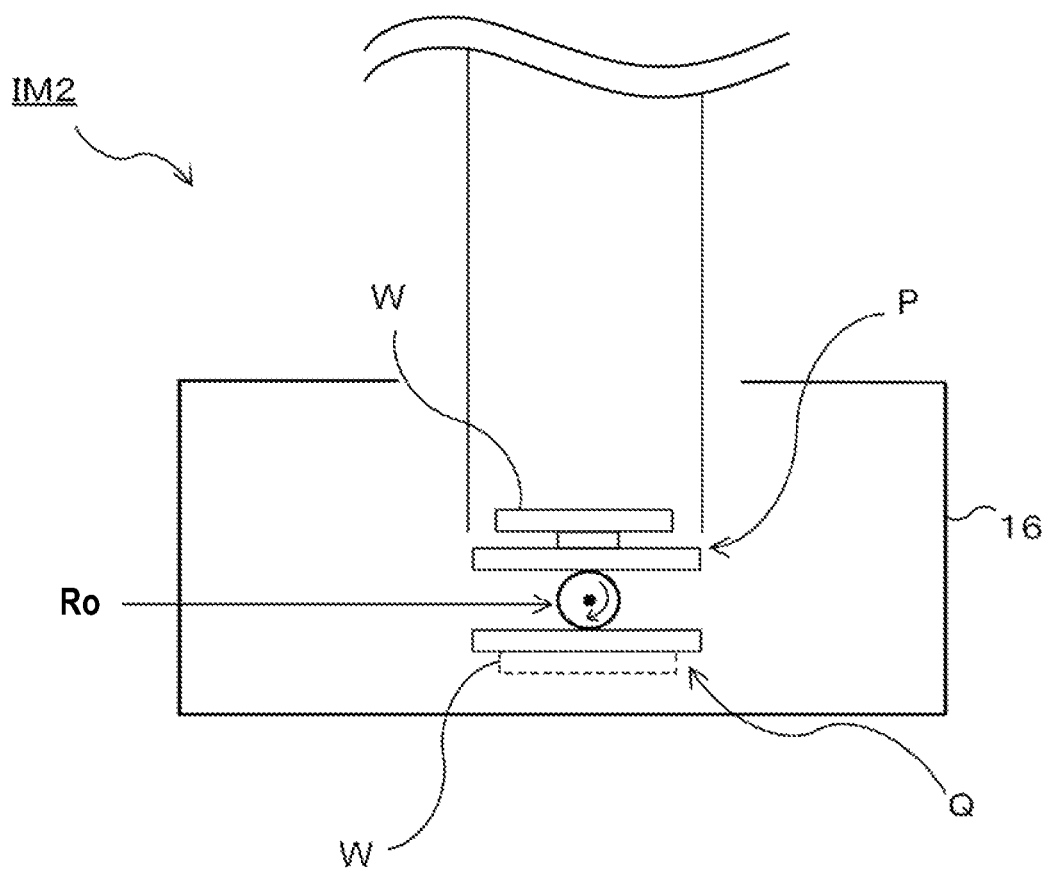
FIG. 5 is a plan view showing an example of an ion implantation apparatus equipped with different types of wafer supporting devices, according to various embodiments.
Figure 6:
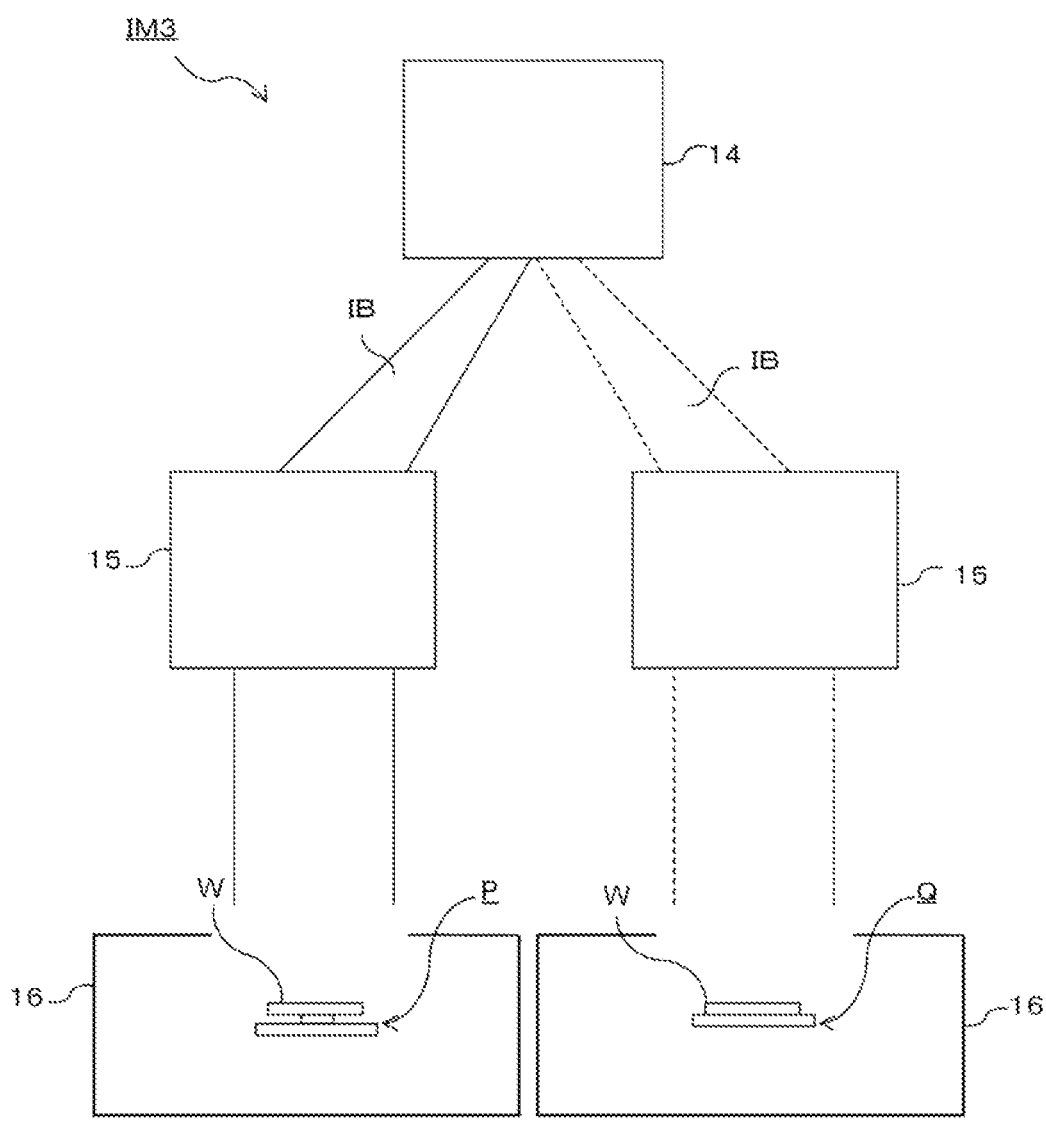
FIG. 6 is a plan view showing another example of the ion implantation apparatus equipped with different types of wafer supporting devices, according to various embodiments.

In order to omit the wafer supporting device replacement operation, and smoothly switch between the high-temperature and normal-temperature ion implantation processing, an ion implantation apparatus IM2 illustrated in FIG. 5 or an ion implantation apparatus IM3 illustrated in FIG. 6 may be employed.

In the ion implantation apparatus IM2 in FIG. 5, the wafer supporting device P for high-temperature implantation and the wafer supporting device Q for normal-temperature implantation may be arranged inside the processing chamber 16 in back-to-back relation to each other, such that wafer supporting surfaces of the two devices take 180° different orientations, respectively.

The wafer supporting devices P, Q may be connected to a rotation mechanism Ro, wherein the rotation mechanism Ro is configured to be rotated in a direction indicated by the arrowed line, thereby allowing switching between the two devices. For example, the rotation mechanism Ro may be connected to a motor and a controller, where the controller controls the motor to rotate the rotation mechanism Ro. The motor and controller may be the same as or different from the motor and controller described above that performs mechanical scanning of the wafer W. In some embodiments, the rotation of the rotation mechanism Ro may be performed manually.

With regard to the configuration of the ion implantation apparatus IM2 that is upstream of the processing chamber 16, the same configuration as that of the ion implantation apparatus IM1 in FIG. 4 may be employed.

In the ion implantation apparatus IM3 in FIG. 6, a beam line downstream of the scanner 14 is guided differently for the high-temperature ion implantation processing and the normal-temperature ion implantation processing. A scanner 14 employed for the illustrated apparatus may be a so-called "bi-directionally deflecting scanner" configured to deflect the ion beam IB toward both right and left sides in FIG. 6.

With regard to a configuration of the ion implantation apparatus IM2 that is upstream of the scanner 14, the same configuration as that of the ion implantation apparatus IM1 may be employed.

Figure 7:
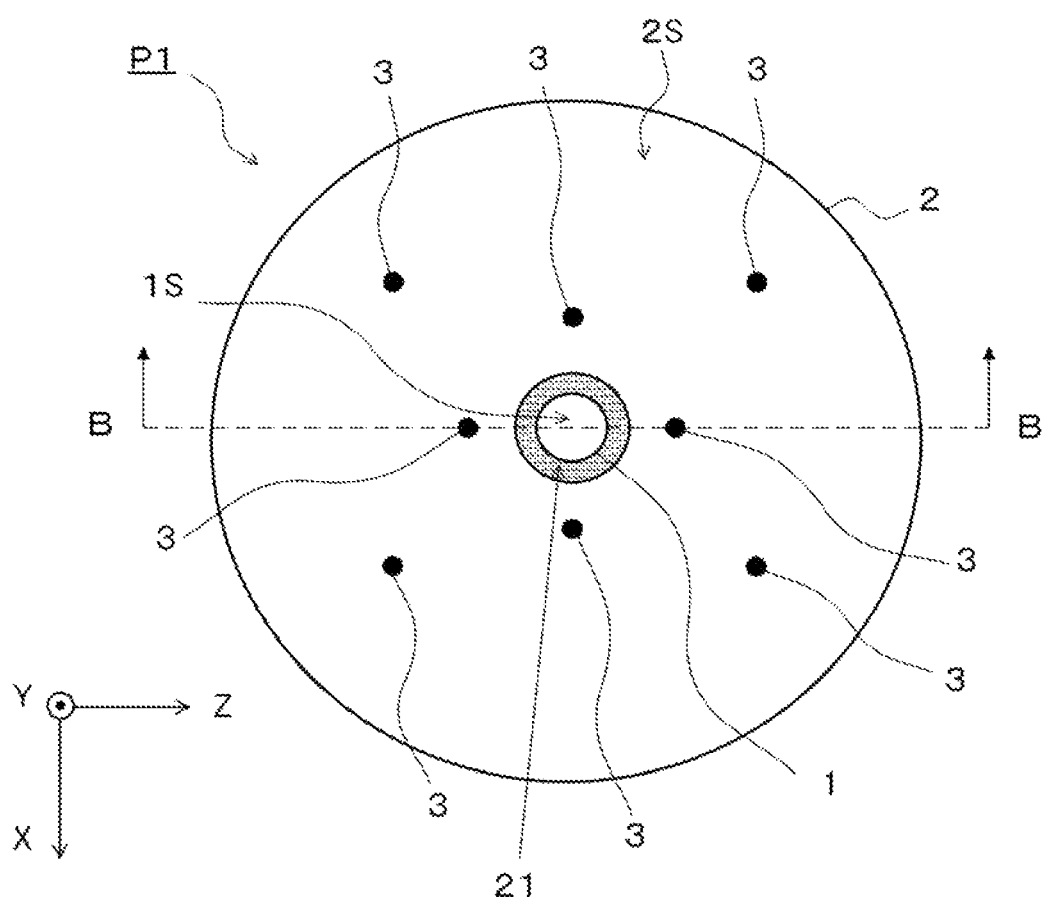
FIG. 7 is a plan view showing another example of the wafer supporting device, according to various embodiments.
Figure 8A:
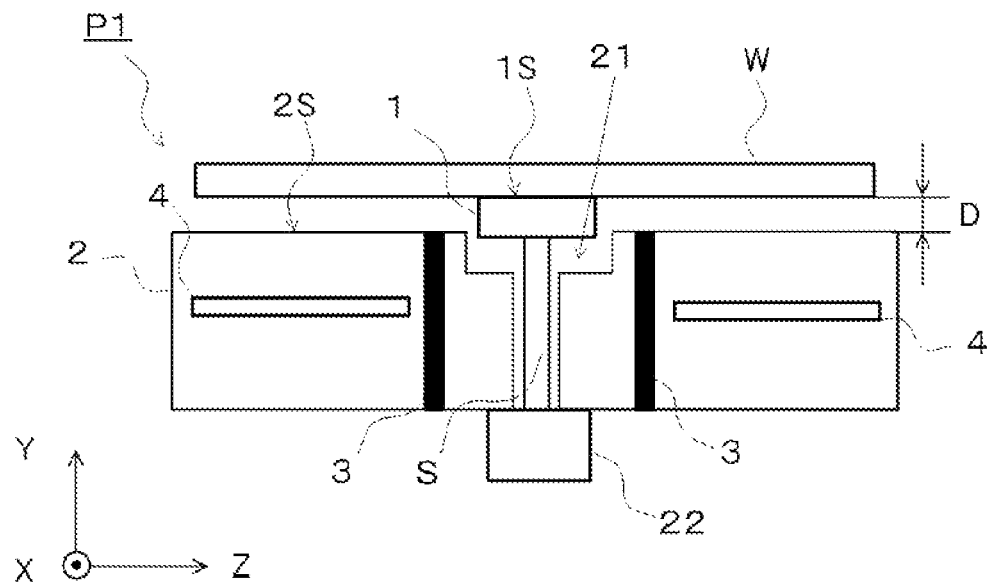
FIGS. 8A and 8B are sectional views taken along the line B-B in FIG. 7.
Figure 8B:
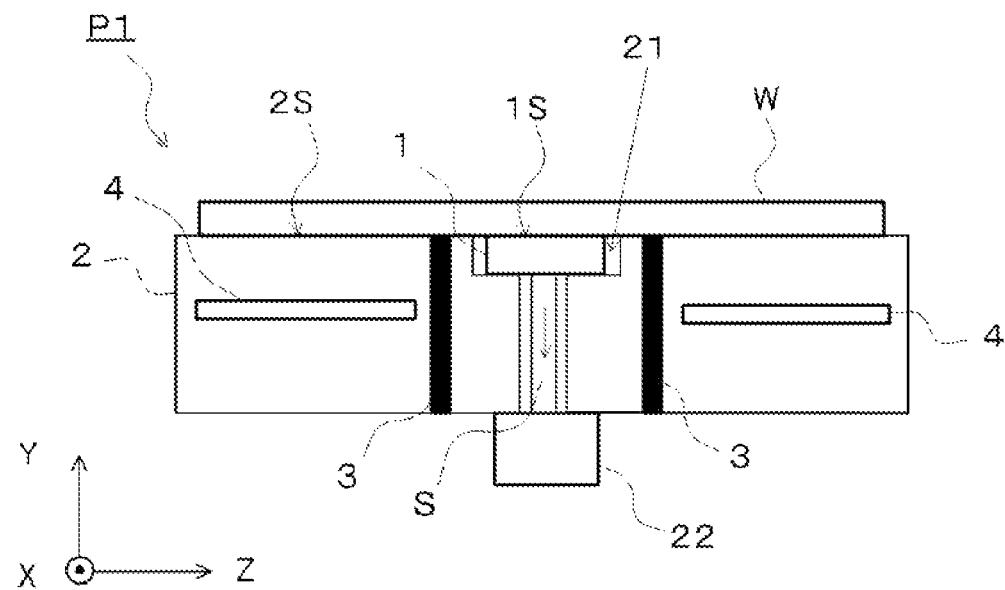

In a case where it is attempted to smoothly switch between the high-temperature and normal-temperature ion implantation processing, using the wafer supporting device P according to various embodiments, a configuration illustrated in FIGS. 7 and 8A-8B may be employed.

A difference in configuration between a wafer supporting device P1 illustrated in FIGS. 7 and 8A and 8B and the wafer supporting device P described with respect to FIGS. 1-3 will be described. FIGS. 8A and 8B are sectional views taken along the line B-B in FIG. 7.

As shown in FIG. 7, the wafer supporting device P1 may have a storage groove 21 formed on the wafer-facing surface 2S of the support base 2.

FIG. 8A corresponds to the wafer supporting device P1 during the high-temperature implantation. One end of a support shaft S is connected to the electrostatic chuck 1. The other end of the support shaft S is coupled to a lifting and lowering device 22 mounted to the support base 2.

In the configuration illustrated in FIG. 8A, the electrostatic chuck 1 is not directly supported by the support base 2. However, the electrostatic chuck 1 may be said to be indirectly supported by the support base 2, because the electrostatic chuck 1 is supported by the support shaft S of the lifting and lowering device 22 which is coupled to the support base 2. During high temperature implantation the support shaft S is moved upwardly by the lifting and lowering device 22 to a position illustrated in FIG. 8A. As a result, the electrostatic chuck 1 is raised to a position such that the attraction surface 1S of the electrostatic chuck 1 and the wafer-facing surface 2S of the support base 2 are spaced apart by the distance D as illustrated with reference to FIGS. 1 and 2. Thereby, the gap corresponding to the distance D is formed between the wafer W that is attracted to the attraction surface 1S of the electrostatic chuck 1 and the wafer-facing surface 2S.

For the normal-temperature implantation, the support shaft S is moved downwardly by the lifting and lowering device 22. As a result, the electrostatic chuck 1 is received inside the storage groove 21, as shown in FIG. 8B. Once the electrostatic chuck 1 is received in the storage groove 21, the attraction surface 1S of the electrostatic chuck 1 and the wafer-facing surface 2S of the support base 2 are located on the same plane, i.e., the attraction surface 1S and the wafer-facing surface 2S are coplanar.

Thus, the back surface of the wafer W comes into contact with both the attraction surface 1S of the electrostatic chuck 1 and the wafer-facing surface 2S of the support base 2, so that heat flowing into the wafer by ion implantation may be released through the electrostatic chuck 1 and the support base 2. During the normal-temperature implantation, the operation of the heater 4 is stopped, and therefore the support base 2 is not heated by the heater 4.

By adjusting the position of the electrostatic chuck 1 as shown in FIGS. 8A and 8B, it becomes possible to smoothly switch between the ion implantation processing at normal temperature and the ion implantation processing at high temperature. In some embodiments, the wafer-facing surface 2S may include the one or more additional electrostatic chucks 31 as illustrated in FIG. 3 to more effectively transfer heat from the wafer W to the support base 2.

Furthermore, in some embodiments, instead of moving the electrostatic chuck 1, the support base 2 may be moved.

Since the central region of the wafer W is supported by the electrostatic chuck 1, heat is more likely to be transferred from the support base 2 to the supported area of the wafer W that is supported by the electrostatic chuck 1, and thereby the supported area becomes a relatively high temperature.

In the remaining area which is not supported by the electrostatic chuck 1, heat of the support base 2 will be transferred from the support base 2 to the wafer W via the heat-transfer gas. However, since the gap formed between the wafer W and the wafer-facing surface 2S is opened in a radius direction of the wafer W, it is not possible to sufficiently increase gas pressure in the gap. This causes a disadvantage that, as compared to the area of the wafer supported by the electrostatic chuck 1, heat transfer at the remaining area which is not supported by the electrostatic chuck 1 becomes insufficient, and thereby a temperature distribution in the wafer surface becomes uneven.

Figure 9:
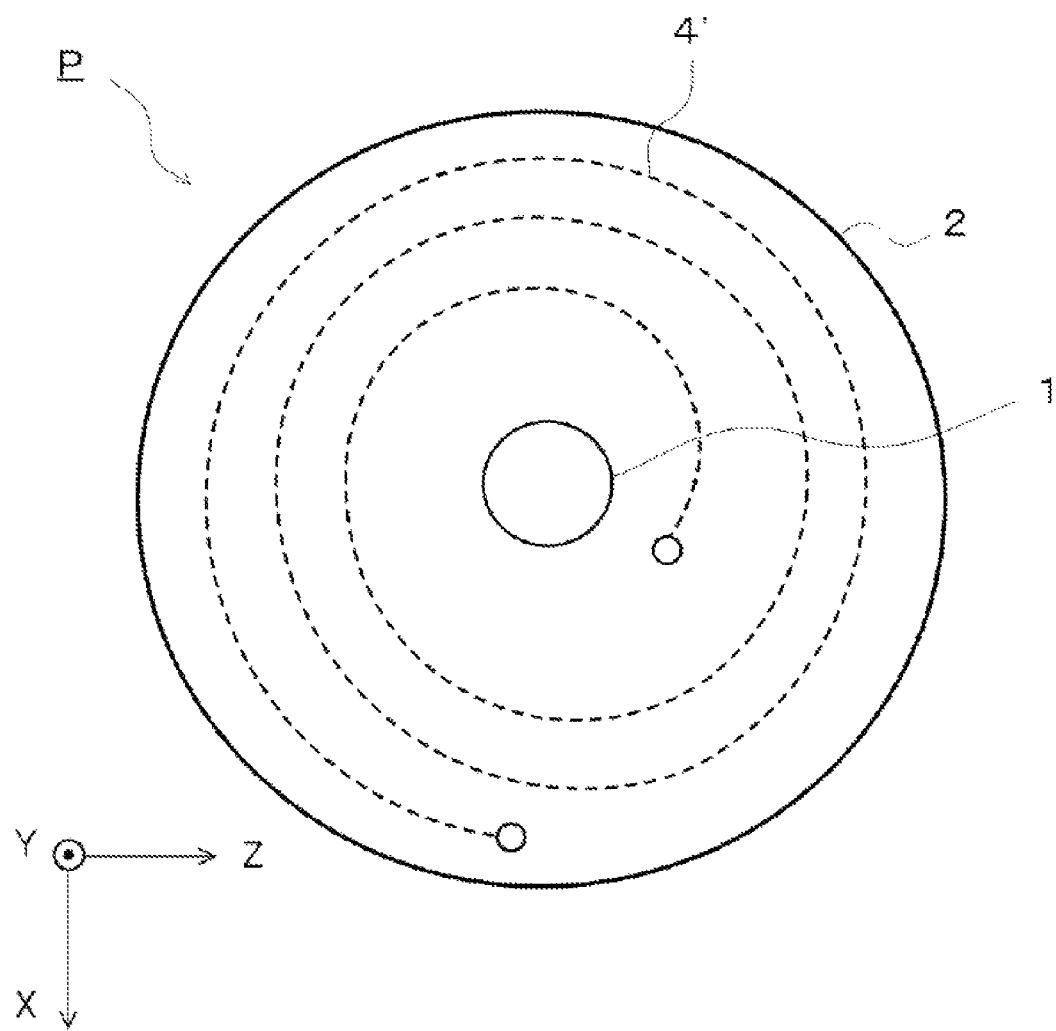
FIG. 9 illustrates a configuration example of a heater pattern according to various embodiments.
Figure 10:
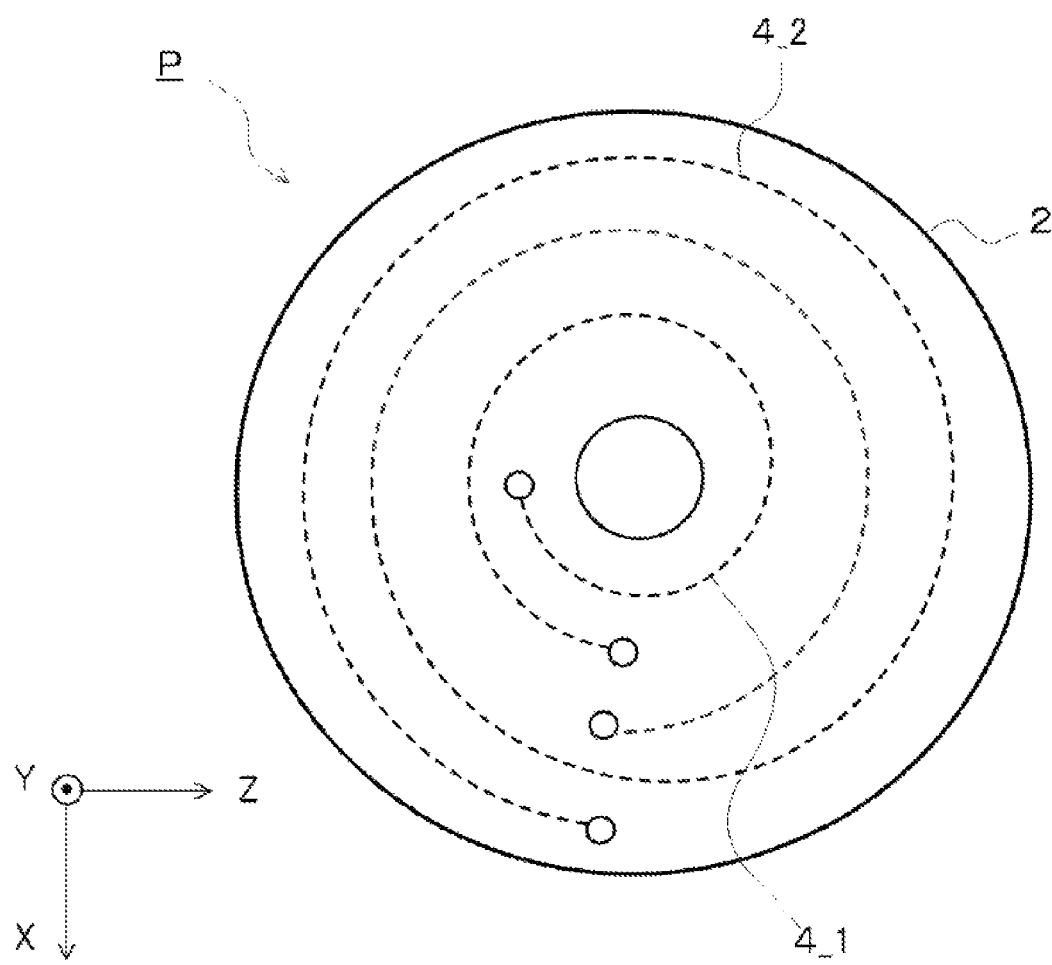
FIG. 10 illustrates another configuration example of the heater pattern, according to various embodiments.

To address this disadvantage, a heater 4' having a heater pattern illustrated in FIG. 9 or FIG. 10 may be employed. In some embodiments, the heater pattern of the heater 4' may be a spiral pattern having a starting point deviated from the center of the electrostatic chuck 1 as illustrated in FIGS. 9 and 10. In FIG. 9, the degree of concentration (density) of a heater pattern is reduced in the vicinity of the central region of the support base 2 on which the electrostatic chuck 1 is disposed, and increased in a peripheral region of the support base 2.

Thus, the temperature of the support base 2 becomes higher in the outer peripheral region than in the central region, so that the uneven temperature distribution in the surface of the wafer W is improved.

In FIG. 10, the heater is divided into two segments, a first segment 4_1 in the vicinity of the central region of the support base 2; and a second segment 4_2 in the peripheral region of the support base 2. By reducing electric power to be input to the first segment 4_1 in the vicinity of the central region as compared to electric power to be input to the second segment 4_2 in the peripheral region, the uneven temperature distribution in the surface of the wafer W is improved, as in the configuration of FIG. 9.

A wafer to be handled by the wafer supporting device P, P1 is not limited to a silicon carbide wafer. Any type of wafer may be supported as long as the wafer is a wafer used for high-temperature implantation.

The flow rate of the gas to be supplied through the gas supply passages 3 is set, e.g., to be equal to the flow rate of noble gas to be supplied to a plasma flood gun installed in the vicinity of the processing chamber of the ion implantation apparatus. The gas to be supplied may be preliminarily warmed, and supplied toward the back surface of the wafer in the form of high-temperature gas. It is not essential to provide the gas supply passages in the wafer supporting device P or P1, and in some embodiments the gas supply passages 3 may be omitted from the support base 2 such that the support base 2 may be simplified.

As the configuration of the electrostatic chuck 1 and/or the one or more additional electrostatic chucks 31, a DC or AC electrostatic check may be used. With regard to the number of electrodes, either a single-pole electrode or a multi-pole electrode may be employed.

For example, if there is concern about a residual attraction force during wafer separation, a three-phase AC electrostatic chuck may be employed. When employing the DC electrostatic chuck, a technique of applying a reverse voltage whose polarity is opposite to that of an attraction voltage during wafer separation may be employed. In addition, instead of turning off the reverse voltage immediately after voltage application, various techniques such as a technique of reducing the magnitude of the reverse voltage stepwisely or linearly, and/or a technique of applying a periodic pulse voltage for a predetermined period of time, may be employed. On the other hand, a technique of, instead of a reverse voltage, applying a voltage whose polarity is the same as that of the attraction voltage and whose magnitude is less than that of the attraction voltage may be employed.

The electrostatic chuck 1 illustrated in the embodiments of FIGS. 1-10 is not equipped with the heater 4. This is because the electrostatic chuck 1 is small in size, and providing the heater 4 causes a more complicated configuration thereof. However, in some embodiments, the electrostatic chuck 1 may be equipped with a heater.

It should be understood that embodiments are not limited to the various embodiments described above, but various other changes and modifications may be made therein without departing from the spirit and scope thereof as set forth in appended claims.

What is claimed is:

1. A wafer supporting device comprising:
a support base having a wafer-facing surface, the support base comprising a heater; and
an electrostatic chuck supported by the support base, the electrostatic chuck having an attraction surface configured to attract a wafer for wafer processing,
wherein, during the wafer processing, the wafer-facing surface and the attraction surface are positioned at respective different positions in a direction perpendicular to the wafer-facing surface so that the attraction surface is separated from the wafer-facing surface by a distance, and
wherein a size of the wafer is greater than a size of the attraction surface and an area of the wafer that is not supported by the attraction surface of the electrostatic chuck is larger than an area of the wafer that is supported by the attraction surface of the electrostatic chuck.

2. The wafer supporting device as recited in claim 1, wherein the electrostatic chuck is supported by the support base at a central region of the support base.

3. The wafer supporting device as recited in claim 2, wherein the support base comprises a gas supply passage for releasing gas from the wafer-facing surface.

4. The wafer supporting device as recited in claim 2, wherein a first temperature generated by the heater in a peripheral region of the wafer-facing surface is higher than a second temperature in a central region of the wafer-facing surface.

5. The wafer supporting device as recited in claim 3, wherein a first temperature generated by the heater in a peripheral region of the wafer-facing surface is higher than a second temperature in a central region of the wafer-facing surface.

6. The wafer supporting device as recited in claim 1, wherein the support base comprises a gas supply passage for releasing gas from the wafer-facing surface.

7. The wafer supporting device as recited in claim 1, wherein a first temperature generated by the heater in a peripheral region of the wafer-facing surface is higher than a second temperature in a central region of the wafer-facing surface.

8. A wafer supporting device comprising:
a support base having a first surface, the support base comprising a heater; and
an electrostatic chuck having an attraction surface configured to attract a wafer,
wherein the first surface is spaced apart from the attraction surface by a distance, and
wherein a size of the wafer is greater than a size of the attraction surface and an area of the wafer that is not supported by the attraction surface of the electrostatic chuck is larger than an area of the wafer that is supported by the attraction surface of the electrostatic chuck.

9. The wafer supporting device as recited in claim 8, wherein the distance is 1 cm or less.

10. The wafer supporting device as recited in claim 8, wherein the electrostatic chuck has an opposing surface to the attraction surface, and the opposing surface is provided on the support base at a central region of the support base.

11. The wafer supporting device as recited in claim 8, further comprising a shaft and a lifting and lowering device mounted to a second surface of the support base that is opposite to the first surface,
wherein a first end of the shaft is coupled to the lifting and lowering device and a second end is coupled to the electrostatic chuck.

12. The wafer supporting device as recited in claim 11, wherein:
the support base comprises a storage groove, during a high temperature process, the electrostatic chuck is raised by the lifting and lowering device such that the first surface is spaced apart from the attraction surface by the distance, and
during a normal temperature process at a temperature less than the high temperature process, the electrostatic chuck is lowered into the storage groove by the lifting and lowering device such that the attraction surface is coplanar with the first surface.

13. The wafer supporting device as recited in claim 8, wherein the support base comprises a gas supply passage.

14. The wafer supporting device as recited in claim 8, wherein a first temperature in a peripheral region of the first surface is higher than a second temperature in a central region of the first surface.

15. The wafer supporting device as recited in claim 8, wherein the heater is a spiral heater.

16. The wafer supporting device as recited in claim 8, wherein the distance defines a gap between the first surface and a surface of the wafer that is attracted to the attraction surface of the electrostatic chuck during wafer processing.

17. The wafer supporting device as recited in claim 8, further comprising one or more additional electrostatic chucks.

18. A system comprising:

an ion source;

an analysis electromagnet and an analysis slit that analyze unwanted ions contained in an ion beam extracted from the ion source; and a processing chamber comprising the wafer supporting device of claim 8, wherein the wafer supporting device is configured to be moved across the ion beam to perform a high temperature process on the wafer.

19. The system as recited in claim 18, further comprising an additional processing chamber comprising a normal temperature wafer supporting device, wherein the normal temperature wafer supporting device is configured to be moved across the ion beam to perform a normal temperature process on the wafer at a lower temperature than a temperature of the high temperature process.

20. The system as recited in claim 18, wherein the processing chamber further comprises a normal temperature wafer supporting device and a rotation mechanism configured to rotate the normal temperature wafer supporting device into a position to perform a normal temperature process on the wafer at a lower temperature than a temperature of the high temperature process.

\* \* \* \* \*